United States Patent
Martineau

(10) Patent No.: US 10,374,550 B2
(45) Date of Patent: Aug. 6, 2019

(54) ARCHITECTURE FOR VOLTAGE SHARING BETWEEN TWO OSCILLATORS

(71) Applicant: COMMISSARIAT A L'ENERGIE ATOMIQUE ET AUX ENERGIES ALTERNATIVES, Paris (FR)

(72) Inventor: Baudoin Martineau, Tencin (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/993,227

(22) Filed: May 30, 2018

(65) Prior Publication Data
US 2018/0367097 A1    Dec. 20, 2018

(30) Foreign Application Priority Data

Jun. 15, 2017 (FR) ...................................... 17 55426

(51) Int. Cl.
H03B 5/12     (2006.01)

(52) U.S. Cl.
CPC ......... *H03B 5/1212* (2013.01); *H03B 5/1228* (2013.01); *H03B 5/1243* (2013.01); *H03B 2200/0076* (2013.01)

(58) Field of Classification Search
CPC .. H03B 5/1212; H03B 5/1243; H03B 5/1228; H03B 2200/0076
See application file for complete search history.

(56) References Cited

U.S. PATENT DOCUMENTS

| 3,305,824 | A   |        | 2/1967 | Brooks et al. |
|-----------|-----|--------|--------|---------------|
| 6,867,656 | B2  | *      | 3/2005 | Hajimiri ................ H03B 27/00 327/118 |
| 2008/0174375 | A1 |     | 7/2008 | Nakamura et al. |
| 2011/0057732 | A1 |     | 3/2011 | Taylor et al. |

(Continued)

FOREIGN PATENT DOCUMENTS

| CN | 102 170 289 A | 8/2011 |
|----|---------------|--------|
| KR | 101 138 487 B1 | 4/2012 |

OTHER PUBLICATIONS

J. Dang et al., "A fully integrated 5.5 GHz cross-coupled VCO with high output power using 0.25um CMOS technology," IEEE 2014, pp. 255-258.

(Continued)

*Primary Examiner* — Jeffrey M Shin
(74) *Attorney, Agent, or Firm* — Baker & Hostetler LLP

(57) ABSTRACT

An electronic system comprises a first and a second oscillator that are mutually cross-coupled and have one and the same resonant frequency, each oscillator comprising an electrical resonator, an active cell having a negative small-signal resistance linked to the electrical resonator, an electric power supply terminal of the active cell, an output for an oscillation signal and a terminal for connection to a ground point, wherein: the electric power supply terminal of the second oscillator and the terminal for connection to a ground point of the first oscillator are linked to one and the same point, termed dynamic ground; and the system also comprises a differential amplifier forming, with the active cell of one of the oscillators, a feedback loop designed to keep the potential of the dynamic ground point at a constant level, dependent on the reference voltage.

14 Claims, 3 Drawing Sheets

(56) References Cited

U.S. PATENT DOCUMENTS

2014/0132359 A1 5/2014 Taghivand
2015/0180528 A1 6/2015 Ragonese et al.

OTHER PUBLICATIONS

K. Ha et al., "Gm-Boosted Complementary Current-Reuse Colpitts VCO with Low Power and Low Phase Noise," IEEE Microwave and Wireless Components Letters, vol. 24, No. 6, Jun. 2014, pp. 418-420.
J. L. González et al., "A 56-GHz LC-Tank VCO With 7% Tuning Range in 65-nm Bulk CMOS for Wireless HDMI," IEEE Transactions on Microwave Theory and Techniques, 2009.
S. A. R. Ahmadi-Mehr et al., "Analysis and Design of a Multi-Core Oscillator for Ultra-Low Phase Noise," IEEE Transactions on Circuits and Systems I: Regular Papers, vol. 63, No. 4, pp. 529-539, Apr. 2016.

* cited by examiner

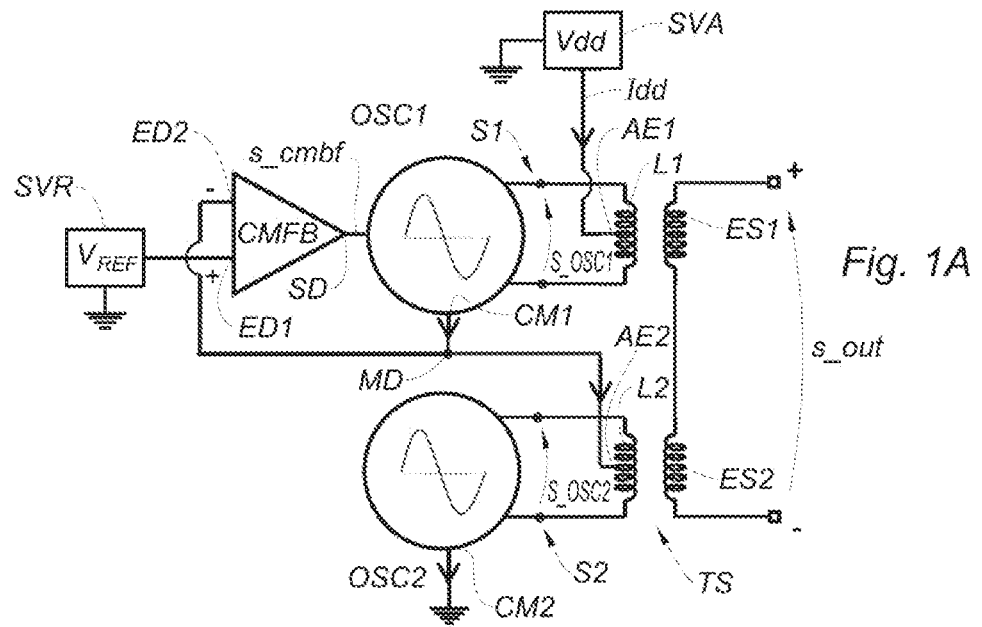
Fig. 1A
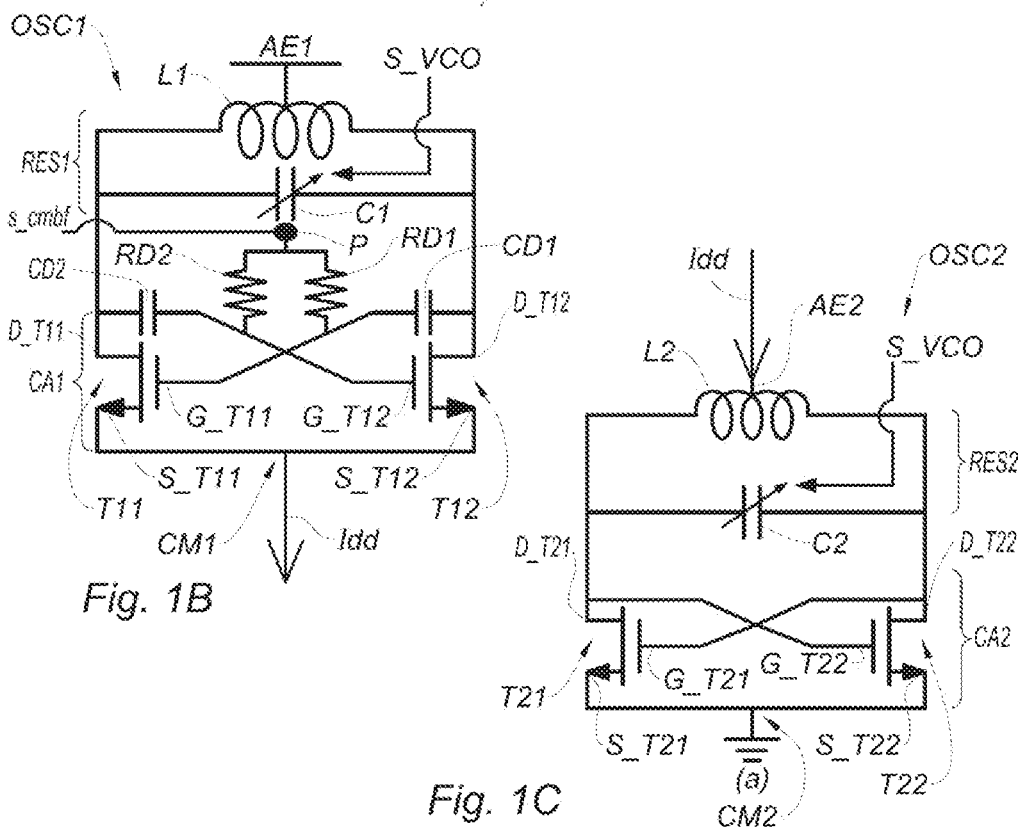
Fig. 1B
Fig. 1C

ARCHITECTURE FOR VOLTAGE SHARING BETWEEN TWO OSCILLATORS

CROSS-REFERENCE TO RELATED APPLICATIONS

This application claims priority to foreign French patent application No. FR 1755426, filed on Jun. 15, 2017, the disclosure of which is incorporated by reference in its entirety.

FIELD OF THE INVENTION

The invention relates to an architecture that allows voltage sharing between two electronic oscillators. It relates to the field of analogue electronics, and in particular to radiofrequency (RF) electronics, and applies in particular to the creation of voltage-controlled oscillators (VCOs) for RF emitters or receivers.

BACKGROUND

The reduction in scale of silicon technologies that has taken place in recent years has led to a large reduction in the supply voltages of transistors, and in the maximum voltage that is able to be applied across the terminals of the latter. The result of this is a severe restriction on the maximum admissible amplitude of the signals able to be generated or processed by circuits using these transistors. By way of example, 65 nm technology CMOS transistors are designed to withstand a drain-source voltage of 1.32 V. These transistors are generally supplied with 1.2 V; in the case of a cross-coupled differential pair oscillator, this would lead to a maximum drain-source voltage that reaches around 2.2 V at the positive peak of the oscillation. In order to ensure reliable operation, it is therefore necessary to limit the supply voltage to around 700 mV, and therefore the peak amplitude of the oscillation signal to just ±500 mV. For example, the article by J. L. González et al. '*A 56-GHz LC-Tank VCO With 7% Tuning Range in 65-nm Bulk CMOS for Wireless HDMI*', RFIC 2009—IEEE Radio Frequency Integrated Circuits Symposium, 2009, describes a cross-coupled differential pair CMOS oscillator in which a PMOS transistor is used to supply a bias current at a voltage level lower than that supplying the circuit.

This results in a significant reduction in the signal-to-noise ratio (SNR), due in particular to the phase noise. This affects the spectral purity of the oscillation signal, which is undesirable in particular in telecommunications applications.

A first approach for addressing this problem is based on microelectronics technology. Those who developed this approach specifically introduced new families of transistors: dual-gate-oxide transistors (GO2) and lateral-drain-extended transistors (LDMOS) for CMOS technologies, and high-voltage bipolar transistors. In doing so, they were able to maintain voltages of the order of 1.5 V to 5 V, at the expense of an increase in manufacturing costs. By way of example, 28 nm UTBB FDSOI technology from STMicroelectronics has both single-oxide transistors (maximum voltage 1 V) and dual-oxide transistors (maximum voltage 1.5-1.8 V). However, these voltages (1.5-1.8 V) are still not sufficient to reach the SNR levels required in modern RF systems.

A second approach, as an alternative or in addition to the first, consists in designing assemblies that make it possible to distribute a supply voltage that is too high to be applied directly across the terminals of a single device between a plurality of transistors. For example, the article by J. Dang et al '*A fully integrated 5.5 GHz cross-coupled VCO with high output power using 0.25 μm CMOS technology*' 2014 21st IEEE International Conference on Electronics, Circuits and Systems (ICECS), Marseilles, 2014, pp. 255-258, describes an oscillator comprising a first differential pair of cross-coupled PMOS transistors and a second differential pair of cross-coupled NMOS transistors. The sources of the PMOS transistors of the first pair are connected to an electric power supply, and their drains are connected to those of the transistors of the second pair and to the terminals of a parallel LC resonant circuit. The sources of the transistors of the second pair are connected to ground. In this way, the supply voltage is shared between the two differential pairs, thereby making it possible to obtain an oscillatory signal with an amplitude higher than if only one pair were to be used. The drawback of this approach lies in the requirement to use PMOS transistors, the performance of which—in particular in terms of noise—is not as good as that of NMOS transistors.

Another possibility is that of using transistors in a 'cascode' configuration. However, this solution imposes frequency restrictions and impairs the efficiency of the circuit.

SUMMARY OF THE INVENTION

The invention aims to overcome the aforementioned drawbacks of the prior art.

One subject of the invention allowing this aim to be achieved is an electronic system comprising a first and a second oscillator that are mutually cross-coupled and have one and the same resonant frequency, each said oscillator comprising an electrical resonator, an active cell having a negative small-signal resistance linked to said electrical resonator, an electric power supply terminal of said active cell, an output for an oscillation signal and a terminal for connection to a ground point, characterized in that:

the electric power supply terminal of the second oscillator and the terminal for connection to a ground point of the first oscillator are linked to one and the same point, termed dynamic ground; and the system also comprises a differential amplifier having a first input that is able to be connected to a reference voltage source, a second input linked to said dynamic ground point, and an output linked to a terminal for controlling the bias current of one from the first and the second oscillator so as to form a feedback loop designed to keep the potential of said dynamic ground point at a constant level, dependent on said reference voltage.

According to particular embodiments of the invention:

The system may also comprise a signal combiner circuit configured to add the voltages of the oscillation signals taken at the outputs of the first and of the second amplifier.

More particularly, this signal combiner circuit may comprise a transformer comprising a first and a second primary winding, which are linked to the outputs of the first and of the second oscillator, respectively, and two secondary windings, which are linked in series and coupled to the first and to the second primary winding, respectively.

Said primary windings may in particular be inductors of the electrical resonators of the oscillators.

The electric power supply terminals of said first and second oscillator may be linked to respective centre taps of said primary windings.

The system may also comprise said reference voltage source, configured to generate said reference voltage with a value equal to half that of said supply voltage.

The electrical resonators of said first and second oscillator may be parallel LC circuits.

The active cells of said first and second oscillator may each comprise at least one transistor having a gate or base, the output of said differential amplifier being linked to the base of the transistor of the active cell of the first oscillator.

The active cells of said first and second oscillator may each comprise a differential pair of cross-coupled transistors. In this case, the output of said differential amplifier may be linked electrically, through DC current, to gates or bases of the cross-coupled transistors of the differential pair of the active cell of said first oscillator, and the gate or base of each of said cross-coupled transistors of the differential pair of the active cell of said first oscillator may be connected to the drain or collector of the other transistor of the pair by way of a decoupling capacitor.

Said oscillators may be voltage-controlled oscillators, configured to be controlled jointly so as to have one and the same oscillation frequency.

The system may also comprise a DC voltage power source linked to the electric power supply terminal of said first oscillator.

Said oscillators may be radiofrequency oscillators.

Said oscillators may be cointegrated in a monolithic manner.

BRIEF DESCRIPTION OF THE DRAWINGS

Other features, details and advantages of the invention will become apparent upon reading the description provided with reference to the appended drawings, which are given by way of example and in which, respectively:

FIG. 1A shows a diagram of an electronic system according to one embodiment of the invention;

FIGS. 1B and 1C show the circuit diagrams of the two oscillators of the system of FIG. 1A;

DETAILED DESCRIPTION

Figure 2A:
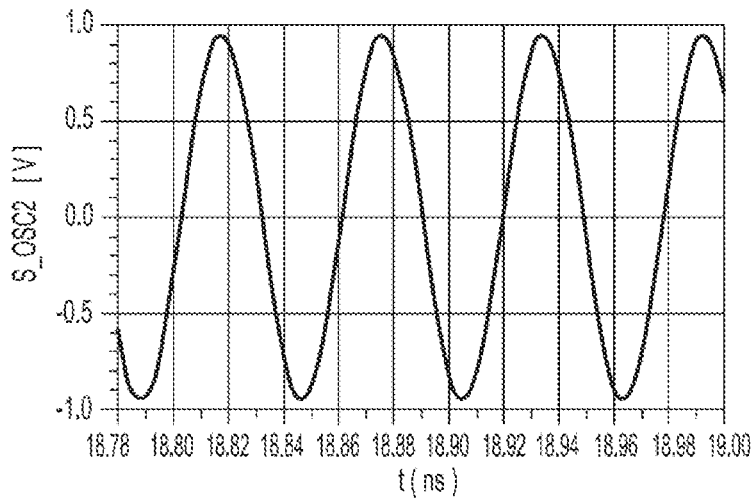
FIG. 2A shows a graph of the shape of the oscillation signal generated by the oscillator of FIG. 1C on its own.

The invention is based on the principle of sharing a relatively high supply voltage between two oscillators operating at the same time, whose signals are able to be combined constructively in order to improve their signal-to-noise ratio. This sharing is ensured and stabilized by a feedback loop.

FIG. 1A shows a diagram of an electronic system according to one embodiment of the invention. This system comprises two electronic oscillators OSC1, OSC2 having one and the same resonant frequency and whose circuit diagrams are illustrated in FIGS. 1B and 1C, respectively.

Each of the two oscillators OSC1, OSC2 comprises an electrical resonator (RES1 for OSC1, RES2 for OSC2) and an active cell (CA1 for OSC1, CA2 for OSC2) having a negative small-signal resistance that makes it possible to compensate for the losses of the resonator. In the embodiment under consideration in this case, the resonators RES1, RES2 are parallel LC circuits: the resonator RES1 comprises an inductor L1 connected in parallel with a capacitive element C1 and the resonator RES2 comprises an inductor L2 connected in parallel with a capacitive element C2.

In FIG. 1A, the inductors L1, L2 are shown outside of the blocks symbolizing the oscillators OSC1, OSC2 to enable better understanding of the operation of the electronic system.

In many applications, it is desired for the oscillators OSC1, OSC2 to have a variable resonant frequency, and in particular to be VCOs. In this case, the capacitive elements C1, C2 are typically p-n junctions that are reverse-biased by a voltage S_VCO that determines their capacitance. It is important for the capacitive elements C1 and C2 to be controlled jointly, so as to keep the resonant frequencies of the two resonators equal.

The active cells CA1, CA2 are of the type with a differential pair of cross-coupled transistors. Thus, the active cell CA1 of the first oscillator OSC1 comprises two identical MOSFET transistors, T11 and T12, the sources S_T11, S_T12 of which are connected together and the drains D_T11, D_T12 of which are connected to opposite terminals of the inductor L1 and of the capacitive element C1. The gate G_T11 of the transistor T11 is connected (by way of a decoupling capacitor CD1 whose function will be explained further on) to the drain of the transistor T12, and the gate G_T12 of the transistor T12 is connected (by way of a decoupling capacitor CD2) to the drain of the transistor T11. Likewise, the active cell CA2 of the second oscillator OSC2 comprises two identical MOSFET transistors, T21 and T22, the sources S_T21, S_T22 of which are connected together and the drains D_T21, D_T22 of which are connected to opposite terminals of the inductor L2 and of the capacitive element C2. The gate G_T21 of the transistor T21 is connected (directly, without a decoupling capacitor) to the drain of the transistor T22, and the gate G_T22 of the transistor T22 is connected (also without a decoupling capacitor) to the drain of the transistor T21.

A DC supply current $I_{dd}$ is injected into the drains of the transistors of each active cell. In the embodiment described in this case, this current is supplied by way of a terminal AE1, AE2 that is linked to the centre tap of the inductor L1, L2 of the oscillator.

As is able to be seen in FIG. 1A, a DC voltage power source SVA is linked to the power supply terminal AE1 of the oscillator OSC1 so as to keep it at a potential $V_{dd}$. The current $I_{dd}$, coming from the source SVA, enters the drains D_T11, D_T12 of the transistors T11, T12 of this oscillator, and exits via their sources S_T11, S_T12. The latter are linked to a point MD, which is called a 'dynamic ground' as its potential does not vary during normal operation of the oscillators. The power supply terminal AE2 of the second oscillator OSC2 is also linked to this point MD. In this way, the current $I_{dd}$ also enters the drains D_T21, D_T22 of the transistors T21, T22 of this oscillator, and exits via their sources S_T21, S_T22. The latter are linked to a ground of the electronic system.

It is readily understood that the average drain-source voltage of the transistors T11, T12 of the oscillator OSC1 has a value of $V_{dd}-V_{MD}$, where $V_{MD}$ is the voltage of the dynamic ground point MD, and that of the transistors T21, T22 of the oscillator OSC2 has a value of $V_{MD}$. Thus, in order to ensure a constant distribution of the supply voltage between the two oscillators, it is necessary to stabilize the voltage $V_{MD}$.

According to the invention, this stabilization is achieved by virtue of a common mode feedback amplifier (CMFB). This type of amplifier is well known from the literature and may, by way of example, be formed from an operational amplifier. The CMFB amplifier receives a DC voltage, termed reference voltage ($V_{REF}$), on one of its inputs ED1 (non-inverting input '+') and the voltage $V_{MD}$ on the other input ED2 (inverting input '−'), and supplies, at its output, a signal s_cmbf proportional to the difference between these two voltages. This signal, the frequency of which is much lower than the resonant frequency $f_0$ of the oscillators, is applied to the gates G_T11, G_T12 of the transistors T11, T12 of the active cell CA1 of the first oscillator OSC1 through the resistors RD1, RD2. The decoupling capacitors CD1, CD2 are required because the drains of these transistors are kept at an average voltage $V_{dd}$, different from s_cmbf. The values of these decoupling capacitors, and those of the resistors RD1, RD2, are chosen such that the decoupling capacitors behave as open circuits with respect to the low-frequency signal s_cmbf, and as short circuits at the resonant frequency $f_0$, making it possible to initiate an oscillation.

This assembly forms a feedback loop that guarantees that $V_{MD}=V_{REF}$. Specifically, if $V_{MD}$ falls and drops below $V_{REF}$, the voltage level of the signal s_cmbf—and therefore the gate voltage of the transistors T11 and T12, increases. Furthermore, as the voltage $V_{MD}$ is applied to the gates of the transistors T21, T22, the current $I_{dd}$ flowing through the two oscillators also tends to drop. These two effects interact to bring about an increase in the source voltage of T11 and T12. However, this source voltage is nothing other than $V_{MD}$, which thus moves towards $V_{REF}$. Conversely, if $V_{MD}$ increases and exceeds $V_{REF}$, the feedback loop intervenes to reduce it.

The operation of the system may be described in summary in the following way. The two oscillators are connected in series in a steady state: they are therefore flowed through by one and the same bias current $I_{dd}$. The oscillator OSC2 is self-biased and imposes a relationship between the value of $I_{dd}$ and that of the potential $V_{MD}$. The signal s_cmbf is applied to a terminal for controlling the bias current flowing through OSC1 (a point—reference P in FIG. 1A—linked to the gate of the transistors T11 and T12); this signal determines the value of $I_{dd}$. The feedback loop sets the value of s_cmbf, and therefore of $I_{dd}$, such that the potential $V_{MD}$ adopts the desired value, equal to (or more generally dependent on) $V_{REF}$.

In the example of FIG. 1A, $V_{REF}=V_{dd}/2$, which means that $V_M=V_{dd}/2$. This means that the supply voltage is distributed equally between the two oscillators. This choice is optimal if the oscillators (or at least their transistors) are identical, but it is entirely possible to distribute the voltage unequally by choosing $V_{REF}\neq V_{dd}/2$, in particular if the transistors of the two oscillators have channels of different widths.

In the example of FIG. 1A, the reference voltage $V_{REF}$ is generated by a voltage source SVR that may quite simply be a voltage divider linked between an output of the power source SVA and ground, but other embodiments are possible.

The oscillators OSC1, OSC2 generate oscillation signals s_osc1, s_osc2 of one and the same frequency, the amplitudes of which depend on the average drain-source voltages of the transistors of said oscillators. Thus, the amplitude of the signal s_osc1 generated by the oscillator OSC1 depends on $V_{dd}$-$V_{REF}$, whereas that of the signal s_osc2 generated by the oscillator OSC2 depends only on $V_{REF}$. The amplitudes are equal if the oscillators are identical and $V_{REF}=V_{dd}/2$. These two signals may be taken at the output gates S1, S2 whose terminals are linked to the drains of the transistors of the respective oscillators or, equivalently, to the terminals of the inductors L1, L2 and of the capacitive elements C1, C2. They may then be combined, that is to say summed, in order to obtain an output signal s_out of higher amplitude and that is therefore less subject to phase noise. In the embodiment of FIG. 1A, this is achieved by virtue of a transformer TS having two secondary windings ES1, ES2 connected in series and coupled inductively to the inductors L1, L2, which perform the role of primary windings.

In order for the combination of the two oscillation signals to lead to the generation of an output signal of higher amplitude, it is necessary for the two oscillators to be tuned (and therefore to have one and the same oscillation frequency) and synchronized (that is to say that they oscillate at least approximately in phase). In practice, this is achieved automatically by virtue of the mutual coupling that is mandatorily present. This coupling is due firstly to the transformer TS, and secondly to the physical proximity of the oscillators, especially when they are cointegrated in a monolithic manner.

The article by S. A. R. Ahmadi-Mehr, M. Tohidian and R. B. Staszewski, "Analysis and Design of a Multi-Core Oscillator for Ultra-Low Phase Noise," *IEEE Transactions on Circuits and Systems I: Regular Papers*, vol. 63, no. 4, pp. 529-539, April 2016, describes a system utilizing the coupling between two electronic oscillators.

Figure 2B:
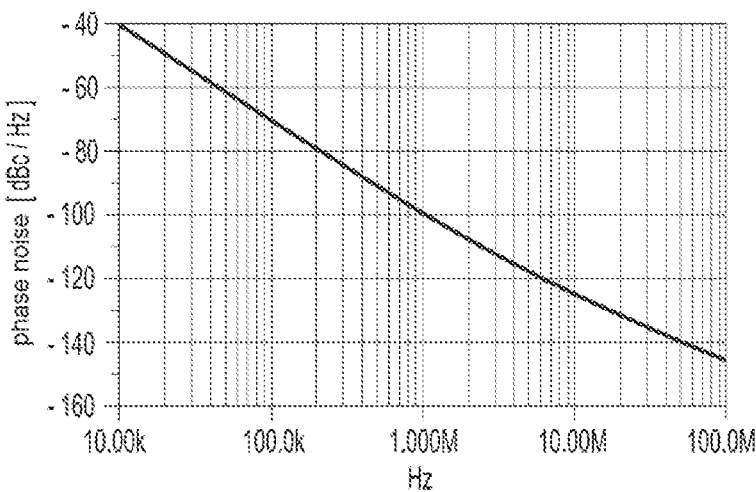
FIG. 2B shows a graph of the spectral density of the phase noise of the signal of FIG. 2A.
Figure 2C:
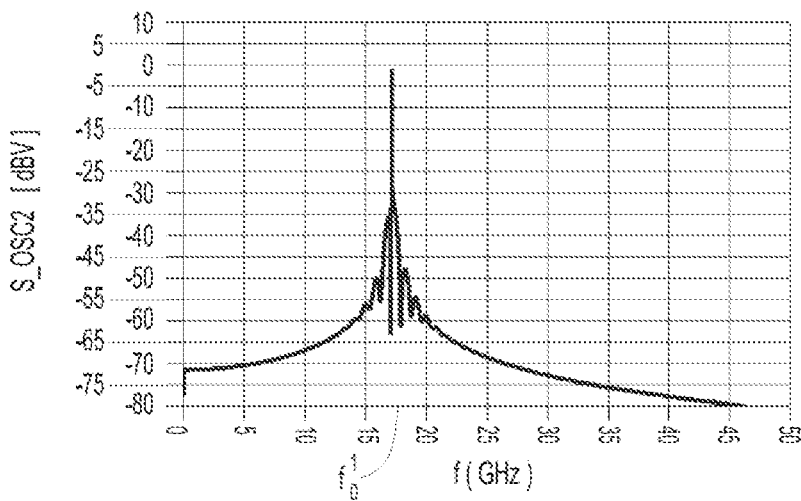
FIG. 2C shows the spectrum of the signal of FIG. 2A.

FIG. 2A shows the shape of an oscillation signal of an oscillator of the type of FIG. 1C, having a supply voltage of 1.2 V. The signal is sinusoidal, with a frequency $f_0^1=17.12$ GHz. FIG. 2B shows that this signal is affected by phase noise the power spectral density of which in relation to the power of the signal at 17.12 MHz (and measured in dBc/Hz) is illustrated in FIG. 2B. It is able to be seen that, at 1 MHz, the noise level has a value of around −99.4 dBc/Hz. This is enough to affect the spectral purity of the signal, as is able to be seen in FIG. 2C.

Figure 3A:
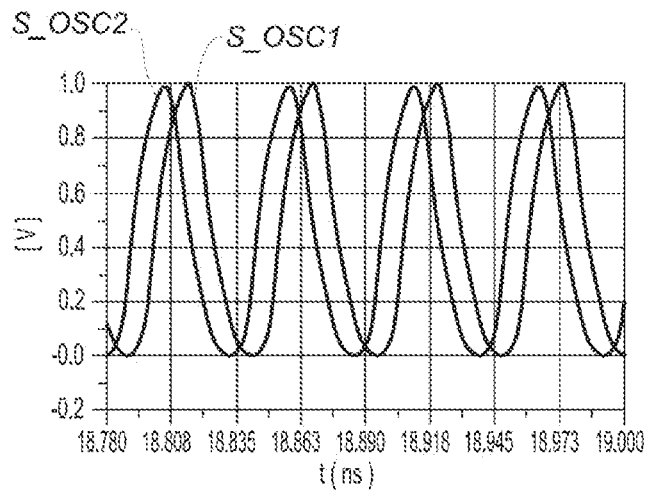
FIG. 3A shows a graph of the shape of the oscillation signals generated by the two oscillators of the electronic system of FIG. 1A.
Figure 3C:
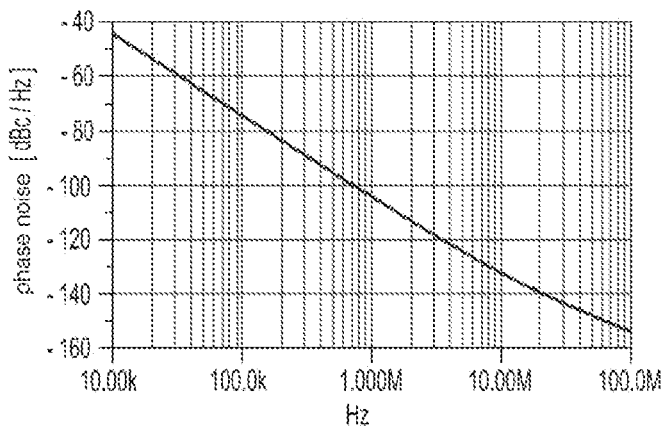
FIG. 3C shows a graph of the spectral density of the phase noise of the signal of FIG. 3B.
Figure 3B:
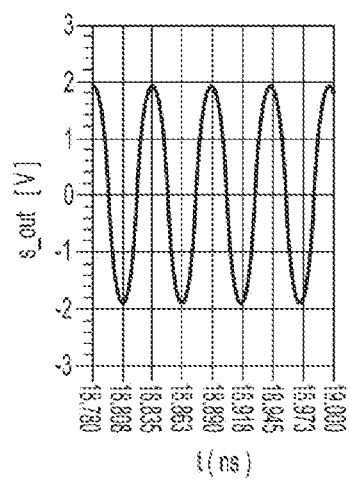
FIG. 3B shows a graph of the shape of the oscillation signal at the output of the electronic system of FIG. 1A.
Figure 3D:
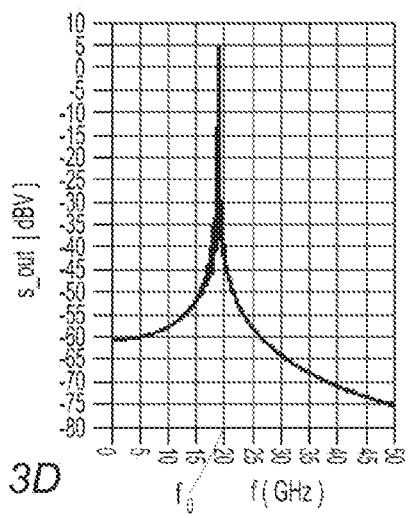
FIG. 3D shows the spectrum of the signal of FIG. 3B.

FIG. 3A shows the two oscillation signals s_osc1 and s_osc2 that are generated by an electronic system of the type of FIGS. 1A-1C; these signals have one and the same frequency and a constant phase relationship, even if they are not exactly in phase with one another. Due to the presence of the transformer TS and the mutual coupling of the oscillators, the frequency of these signals is modified slightly with respect to that of a single oscillator and has a value of $f_0$=18.85 MHz. FIG. 3B shows the shape of the signal s_out obtained by combining the two individual signals s_osc1 and s_osc2: it is able to be observed that the peak-to-peak amplitude of s_out has a value of almost 4 V. FIG. 3B shows that the phase noise has a power spectral density of around −104.4 dBc/Hz, that is to say an improvement of 5 dBc/Hz for the phase noise (in theory, a gain of 6 dBc/Hz could be expected, but the transformer has losses and the synchronization of the oscillators is imperfect). FIG. 3D makes it possible to verify that the spectral purity of the signal has substantially improved.

The invention has been described with reference to one particular embodiment, but numerous variants may be envisaged. For example:

The feedback signal s_cmbt could be applied to the second oscillator OSC2. In this case, the voltage $V_{MD}$ would have to be applied to the non-inverting input of the differential amplifier, and the reference voltage to its inverting input.

The oscillators OSC1, OSC2 do not necessarily have to be VCOs.

The oscillators do not necessarily have to operate in the radiofrequency domain (1 MHz or more), or even microwave frequency domain (1 GHz or more): the invention is also suitable for oscillators operating at a lower frequency.

The active cells of the oscillators do not necessarily have to be of cross-coupled differential pair type; other circuit topologies may make it possible to obtain a negative small-signal resistance. This is the case in particular for conventional 'Colpitts' and 'Hartley' assemblies having a single transistor. The use of a differential structure is nevertheless preferred.

The electrical resonators do not necessarily have to be of parallel LC type. If the resonant frequency is able to be fixed, crystal resonators may even come into question.

The transistors of the oscillators do not necessarily have to be of MOSFET type. Bipolar transistors may in particular come into question. It is beneficial to note that bipolar transistors are subject to a risk of thermal runaway. To avoid this, it is conventional to connect what is termed a 'ballast' resistor to the emitters of the bipolar transistors in a common emitter configuration; however, this has the drawback of impacting the energy efficiency of the circuit. In the case of the invention, the feedback loop that stabilizes the value of $V_{MD}$ is sufficient to prevent any thermal runaway, even if there are no ballast resistors. The energy efficiency of the bipolar oscillators is thereby improved.

It is advantageous to inject the bias current $I_{dd}$ in correspondence with the centre taps of the inductors of the oscillators. This, in combination with the use of differential active cells, prevents the oscillation signals from being able to travel through the feedback loop and disturbing the operation of the system. As a variant, it is possible to use capacitors connected to ground to filter the oscillation signals in the feedback loop.

The signals generated by the two oscillators may be combined using means other than a transformer, for example a Wilkinson splitter used as a combiner.

The invention claimed is:

1. An electronic system comprising a first and a second oscillator that are mutually cross-coupled and have one and the same resonant frequency, each said oscillator comprising an electrical resonator, an active cell having a negative small-signal resistance linked to said electrical resonator, an electric power supply terminal of said active cell, an output for an oscillation signal and a terminal for connection to a ground point, wherein:
   the electric power supply terminal of the second oscillator and the terminal for connection to a ground point of the first oscillator are linked to one and the same point, termed dynamic ground; and
   the system also comprises a differential amplifier having a first input that is able to be connected to a reference voltage source, a second input linked to said dynamic ground point, and an output linked to a terminal for controlling the bias current of one from the first and the second oscillator so as to form a feedback loop designed to keep the potential of said dynamic ground point at a constant level, dependent on said reference voltage.

2. The electronic system according to claim 1, also comprising a signal combiner circuit configured to add the voltages of the oscillation signals taken at the outputs of the first and of the second amplifier.

3. The electronic system according to claim 2, wherein said signal combiner circuit comprises a transformer comprising a first and a second primary winding, which are linked to the outputs of the first and of the second oscillator, respectively, and two secondary windings, which are linked in series and coupled to the first and to the second primary winding, respectively.

4. The electronic system according to claim 3, wherein said primary windings are inductors of the electrical resonators of the oscillators.

5. The electronic system according to claim 3, wherein the electric power supply terminals of said first and second oscillator are linked to respective centre taps of said primary windings.

6. The electronic system according to claim 1, also comprising said reference voltage source, configured to generate said reference voltage with a value equal to half that of said supply voltage.

7. The electronic system according to claim 1, wherein the electrical resonators of said first and second oscillator are parallel LC circuits.

8. The electronic system according to claim 1, wherein the active cells of said first and second oscillator each comprise at least one transistor having a gate or base, the output of said differential amplifier being linked to the base of the transistor of the active cell of the first oscillator.

9. The electronic system according to claim 1, wherein active cells of said first and second oscillator each comprise a differential pair of cross-coupled transistors.

10. The electronic system according to claim 9, wherein:
   the output of said differential amplifier is linked electrically, through DC current, to gates or bases of the cross-coupled transistors of the differential pair of the active cell of said first oscillator; and
   the gate or base of each of said cross-coupled transistors of the differential pair of the active cell of said first oscillator is connected to the drain or collector of the other transistor of the pair by way of a decoupling capacitor.

11. The electronic system according to claim 1, wherein said oscillators are voltage-controlled oscillators, configured to be controlled jointly so as to have one and the same oscillation frequency.

12. The electronic system according to claim 1, also comprising a DC voltage power source linked to the electric power supply terminal of said first oscillator.

13. The electronic system according to claim 1, wherein said oscillators are radiofrequency oscillators.

14. The electronic system according to claim 1, wherein said oscillators are cointegrated in a monolithic manner.

* * * * *